United States Patent
Yang et al.

(10) Patent No.: US 10,658,611 B2
(45) Date of Patent: May 19, 2020

(54) ENCAPSULATION METHOD OF OLED PANEL AND A ENCAPSULATION STRUCTURE THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Zhongguo Yang, Guangdong (CN); Jinchuan Li, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 350 days.

(21) Appl. No.: 15/736,537

(22) PCT Filed: Nov. 27, 2017

(86) PCT No.: PCT/CN2017/113008
§ 371 (c)(1),
(2) Date: Dec. 14, 2017

(87) PCT Pub. No.: WO2019/075854
PCT Pub. Date: Apr. 25, 2019

(65) Prior Publication Data
US 2019/0386244 A1  Dec. 19, 2019

(30) Foreign Application Priority Data

Oct. 16, 2017 (CN) .......................... 2017 1 0963892

(51) Int. Cl.
*H01L 51/52* (2006.01)
*H01L 51/00* (2006.01)
*H01L 51/56* (2006.01)

(52) U.S. Cl.
CPC ........ *H01L 51/5243* (2013.01); *H01L 51/001* (2013.01); *H01L 51/0028* (2013.01); *H01L 51/5246* (2013.01); *H01L 51/56* (2013.01)

(58) Field of Classification Search
CPC . H01L 51/5253; H01L 27/3244; H01L 51/56; H01L 51/0097
See application file for complete search history.

(56) References Cited

U.S. PATENT DOCUMENTS

| 5,874,804 A * | 2/1999 | Rogers .................. H05B 33/04 313/504 |
| 2018/0198088 A1* | 7/2018 | Jin ....................... H01L 51/5246 |

FOREIGN PATENT DOCUMENTS

| CN | 103956435 | 7/2014 |
| CN | 106206994 | 12/2016 |

(Continued)

*Primary Examiner* — Karen Kusumakar
(74) *Attorney, Agent, or Firm* — Hemisphere Law, PLLC; Zhigang Ma

(57) ABSTRACT

The present disclosure provides a encapsulation method and a encapsulation structure of an OLED panel. In the encapsulation method of the OLED panel, a circle of liquid metal is disposed on the encapsulation cover plate inside the sealant, the encapsulation cover plate and the TFT substrate are vacuum-sealed to obtain the encapsulation structure. When the external water and oxygen penetrate through the organic material sealant into the encapsulation structure, the liquid metal will react with the invading oxygen and forms a liquid metal oxide film on its surface to form a dense water-oxygen barrier layer, which can effectively prevent water and oxygen from entering the OLED device to achieve a great encapsulation effect.

12 Claims, 4 Drawing Sheets

(56) References Cited

FOREIGN PATENT DOCUMENTS

| CN | 106222490 | | 12/2016 |
|----|-----------|---|---------|
| CN | 106601592 | | 4/2017 |
| CN | 107046104 | * | 8/2017 |
| CN | 107046104 A | | 8/2017 |

* cited by examiner

ENCAPSULATION METHOD OF OLED PANEL AND A ENCAPSULATION STRUCTURE THEREOF

RELATED APPLICATIONS

The present application is a National Phase of International Application Number PCT/CN2017/113008, filed on Nov. 27, 2017 and claims the priority of China Application 201710963892.9, filed on Oct. 16, 2017.

FIELD OF THE DISCLOSURE

The present disclosure relates to a field of a display technique. In particular, it includes a encapsulation method of an organic light emitting display panel (OLED) and an OLED encapsulation structure.

BACKGROUND

Organic Light Emitting Display (OLED) has self-luminous, low driving voltage, high luminous efficiency, short response time, sharpness and contrast, nearly 180° viewing angle, wide temperature range, flexible, large-area panchromatic and many other advantages, which is recognized as the most promising display device in the field.

OLED can be classified into passive matrix OLED (PMOLED) and active matrix OLED (AMOLED) according to the driving mode, that is, direct addressing and thin film transistor (TFT) matrix addressing. Among them, AMOLED has a matrix arrangement of pixels, belonging to the active display type with high luminous efficiency, is usually used for high-definition large-size display device.

OLED display technology is different from the traditional liquid crystal display technology, it does no need backlight, and adopts a very thin layer of organic materials and glass substrates. When the current goes through, these organic materials will light. However, due to organic materials easily react with water vapor or oxygen, these organic materials applied in display device is very demanding on encapsulation of OLED display. Therefore, it is crucial for a stable luminescence of OLED devices by improving the encapsulation inside the OLED device and isolating the OLED device from the external environment as far as possible.

At present, the encapsulation of a large-sized OLED device is mainly achieved by coating a sealant (dam) on a hard-cover plate (such as glass or metal), placing a moisture absorbent (getter) inside the sealant, then matching the encapsulation cover plate coated with the sealant to the TFT substrate provided with the OLED device, and curing the sealant to complete the encapsulation. However, since the sealant is generally made of an organic substance, the structure of which cannot be tightly sealed even when the sealant is cured, the effect of blocking the water and oxygen is not good either. At the same time, although the moisture absorbent can absorb water vapor, it merely delays water vapor intruding into the OLED device, and does not fundamentally prevent the intrusion of water and oxygen, so that the encapsulation structure of the water-oxygen barrier performance is poor.

As a new material developed in recent years, alloys of indium and indium have some unique properties that have low permeability to moisture and oxygen, low melting point, good plasticity, a certain degree of flexibility, and a wide application prospect in the electronics industry. Among them, a binary eutectic alloy composed of indium and gallium has a similar density to the solid metal, excellent water-oxygen barrier performance, and flowable at room temperature. When exposed to air, oxygen in the air reacts with the binary eutectic alloy composed of indium and gallium at room temperature, and gradually hardening on the surface of the material to form an very dense oxide with excellent water-oxygen barrier property. Meanwhile also preventing the interior of the material from being oxidized so that the interior remains liquid and thus remains flexible.

SUMMARY

An objective of the present invention is to provide a encapsulation method for an OLED panel, which can effectively prevent water and oxygen from entering the OLED device and has good encapsulation effect.

Another objective of the present invention is to provide a encapsulation structure of an OLED panel, which can effectively prevent water and oxygen from entering the OLED device and has good encapsulation effect.

To achieve the above objectives, the present disclosure provides a encapsulation method for an OLED panel, comprising the following steps:

step S1, providing a encapsulation cover plate;

step S2, coating a circle of sealant on the encapsulation cover plate;

step S3, coating a circle of liquid metal on the encapsulation cover plate inside of the sealant;

step S4, providing a TFT substrate, and forming an inorganic insulating layer on the TFT substrate corresponding to the liquid metal on the encapsulation cover plate;

step S5: fabricating an OLED device on the TFT substrate inside the inorganic insulating layer;

step S6, vacuum sealing the TFT substrate and the encapsulation cover plate to make the sealant in contact with the TFT substrate, and to make the inorganic insulating layer in contact with the liquid metal, and curing the sealant to complete the encapsulation of the OLED panel.

In the step S3, after the liquid metal is coated, a filling glue is further coated on the encapsulation cover plate in a region inside the liquid metal.

In the step S5, further forms an inorganic barrier layer on the TFT substrate covering the OLED device after the OLED device is fabricated.

In the step S6, the filling glue is cured while curing the sealant; after the step S6, the filling glue fills a space surrounded by the encapsulation cover plate, the liquid metal, the inorganic insulating layer, the TFT substrate and the inorganic barrier layer.

The step S2, the step S3 and the step S6 are performed in a nitrogen atmosphere.

A width of the inorganic insulating layer is greater than a width of the liquid metal after the step S6.

In the step S2, the sealant is coated through a nozzle; in the step S3, the liquid metal is sprayed through the nozzle; in the step S3, the filling glue is coated by dispenser; in step S5, the inorganic barrier layer is formed by low temperature plasma enhanced chemical vapor deposition; and in the step S6, the sealant and the filling glue are cured by ultraviolet light irradiation, heat curing, or both the ultraviolet light irradiation curing and heat curing.

A material of the liquid metal is a binary eutectic alloy of indium and gallium.

The present disclosure further provide a encapsulation structure of an OLED panel, comprising: a TFT substrate; an OLED device disposed on the TFT substrate; a encapsulation cover plate disposed above the TFT substrate, a sealant disposed between the TFT substrate and the encapsulation cover plate outside the OLED device, an inorganic insulating layer disposed on the TFT substrate between the OLED device and the sealant, and a liquid metal disposed between the inorganic insulating layer and the encapsulation cover plate.

The encapsulation structure of the OLED panel further comprises: an inorganic barrier layer disposed on the TFT substrate covering the OLED device, and an filling glue filling a space surrounded by the encapsulation cover plate, the liquid metal, the inorganic insulating layer, the TFT substrate, and the inorganic barrier layer.

A width of the inorganic insulating layer is greater than a width of the liquid metal.

A material of the liquid metal is a binary eutectic alloy of indium and gallium.

The present disclosure further provides yet another encapsulation method of an OLED panel, comprising:

step S1, providing a encapsulation cover plate;

step S2, coating a circle of sealant on the encapsulation cover plate;

step S3, coating a circle of liquid metal on the encapsulation cover plate inside the sealant;

step S4, providing a TFT substrate, and forming an inorganic insulating layer on the TFT substrate corresponding to the liquid metal on the encapsulation cover plate;

step S5: fabricating an OLED device on the TFT substrate inside the inorganic insulating layer;

step S6, vacuum sealing the TFT substrate and the encapsulation cover plate to make the sealant in contact with the TFT substrate, and to make the inorganic insulating layer in contact with the liquid metal, and curing the sealant to complete the encapsulation of the OLED panel;

wherein in step S3, after the liquid metal is coated, a filling glue is further coated on the encapsulation cover plate in a region inside the liquid metal;

wherein in the step S5, the inorganic barrier layer covering the OLED device is formed on the TFT substrate after the OLED device is fabricated;

wherein in the step S6, the filling glue is cured while curing the sealant; after the step S6, the filling glue fills a space surrounded by the encapsulation cover plate, the liquid metal, the inorganic insulating layer, the TFT substrate and the inorganic barrier layer;

wherein, the step S2, the step S3 and the step S6 are all performed in a nitrogen atmosphere;

wherein a width of the inorganic insulating layer is greater than a width of the liquid metal after the step S6;

wherein a material of the liquid metal is a binary eutectic alloy of indium and gallium.

The beneficial effects of the present disclosure are: the present disclosure provides a encapsulation method for an OLED panel, wherein a circle of liquid metal is disposed on the encapsulation cover plate inside the sealant, and the encapsulation cover plate and the TFT substrate are vacuum-sealed to obtain the encapsulation structure. When the external water and oxygen penetrates through the organic material sealant into the encapsulation structure, the liquid metal will react with the invading oxygen and forms a liquid metal oxide film on its surface to form a dense water-oxygen barrier layer, which can effectively prevent water and oxygen from entering the OLED devices, achieve a great encapsulation effect. The encapsulation structure of the OLED panel provided by the present disclosure can effectively prevent water and oxygen from entering the OLED device and has good encapsulation effect.

BRIEF DESCRIPTION OF THE DRAWINGS

For further understanding of the features and technical contents of the present disclosure, references are made to the following detailed description and accompanying drawings of the present disclosure. However, the drawings are for reference only and are not intended to limit the present disclosure.

In the drawings.

DETAILED DESCRIPTION OF PREFERRED EMBODIMENTS

To further illustrate the technical means adopted by the present disclosure and the effects thereof, the present disclosure is described in the following preferred embodiments and the accompanying drawings in detail.

Figure 1:
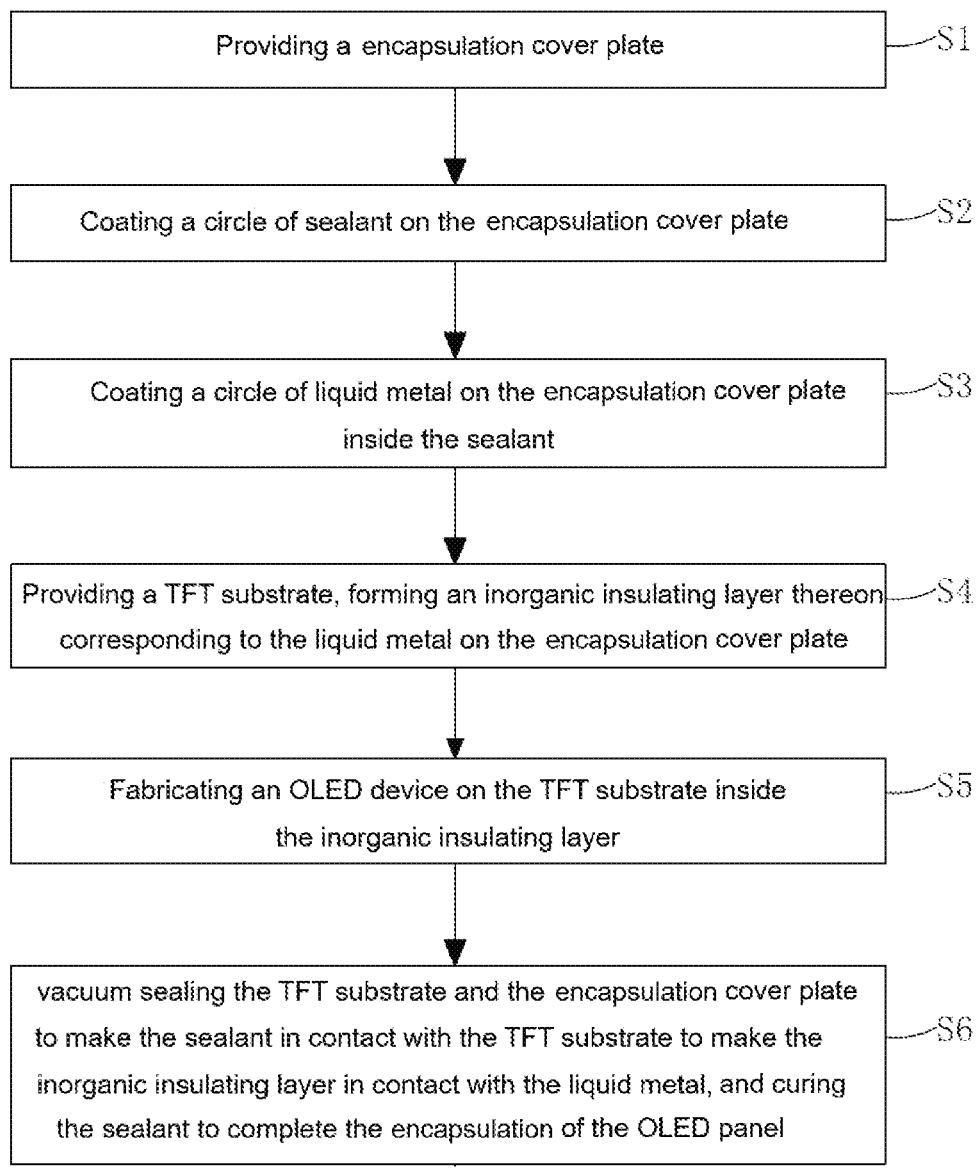
FIG. 1 is a flow chart for a encapsulation method of an OLED panel according to the present disclosure.
Figure 2:
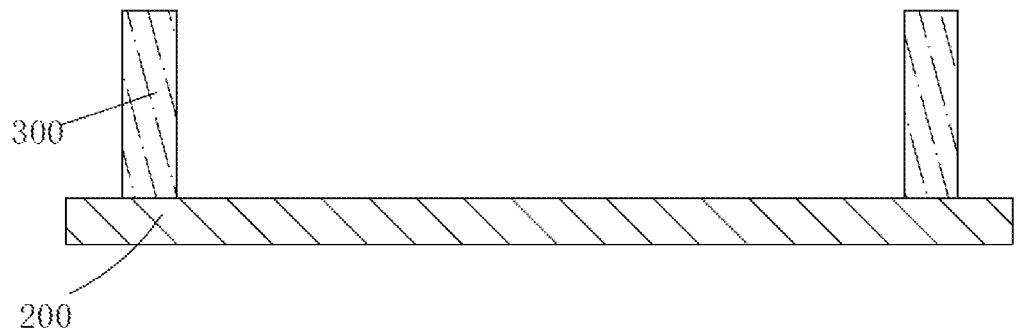
FIG. 2 is a schematic diagram for a encapsulation method of an OLED panel according to step S1 and step S2 of the present disclosure.

Please refer to FIG. 1, the present disclosure provides a encapsulation method of an OLED panel, comprising the following steps:

Step S1, referring to FIG. 2, providing a encapsulation cover plate 200. Specifically, a material of the encapsulation cover plate is glass.

Step S2, referring to FIG. 2, coating a circle of sealant 300 on the encapsulation cover plate 200. Specifically, the sealant 300 is an organic material sealant commonly used in the field. Specifically, in the step S2, the sealant 300 is coated through a nozzle. Furthermore, in the step S2, the sealant 300 is coated by a multi-dispenser.

Figure 3:
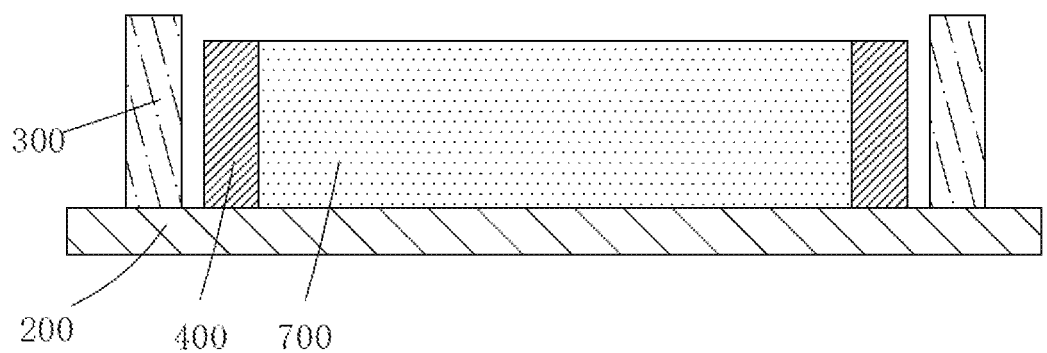
FIG. 3 is a schematic diagram for a encapsulation method of an OLED panel according to step S3 of the present disclosure.

Step S3, referring to FIG. 3, coating a circle of liquid metal 400 on the encapsulation cover plate 200 inside of the sealant 300. The liquid metal 400 can react with oxygen to form an oxidation reaction and form a dense liquid metal oxide film with strong water-oxygen barrier property on the surface. Specifically, the liquid metal 400 is made of a binary eutectic alloy of indium and gallium. Preferably, the binary eutectic alloy of indium and gallium has a mass ratio of indium to gallium of 1:3. Specifically, both the steps S2 and S3 are performed in a nitrogen atmosphere to prevent the liquid metal 400 from being oxidized during the manufacturing process, so as to maintain the liquid state at all times to facilitate the encapsulation process. Specifically, referring to FIG. 3, after the liquid metal 400 is coated, the filling glue 700 is coated on the encapsulation cover 200 in a region inside the liquid metal 400. Specifically, in the step S3, the liquid metal 400 is coated through a nozzle, and the filling glue 700 is coated by dispenser. Further, in the step S3, the liquid metal 400 is coated by a multi dispenser.

Figure 4:
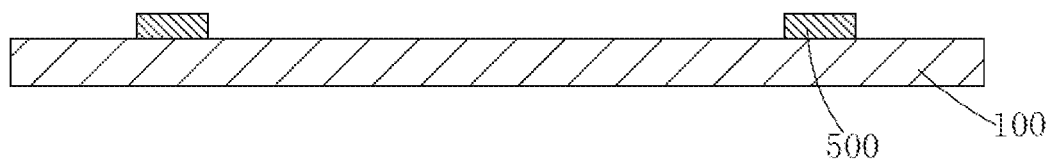
FIG. 4 is a schematic diagram for a encapsulation method of an OLED panel according to step S4 of the present disclosure.

Step S4, referring to FIG. 4, providing a TFT substrate 100, and forming an inorganic insulating layer 500 on the TFT substrate 100 corresponding to the liquid metal 400 on the encapsulation cover plate 200. Specifically, the TFT substrate 100 includes a base substrate and a TFT array layer disposed on the base substrate (not shown), the inorganic insulating layer 500 is disposed on the TFT array layer.

Figure 5:
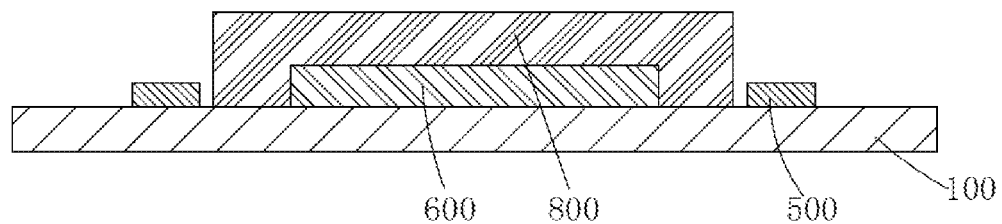
FIG. 5 is a schematic diagram for a encapsulation method of an OLED panel according to step S5 of the present disclosure.

Step S5: referring to FIG. 5, fabricating an OLED device 600 on the TFT substrate 100 inside the inorganic insulating layer 500. Specifically, the step S5 further forms an inorganic barrier layer 800 on the TFT substrate 100 covering the OLED device 600 after the OLED device 600 is fabricated. Further, in the step S5, an inorganic barrier layer 800 is formed by low temperature plasma enhanced chemical vapor deposition. The material of the inorganic barrier layer 800 is silicon nitride, silicon oxide or silicon oxynitride.

Figure 6:
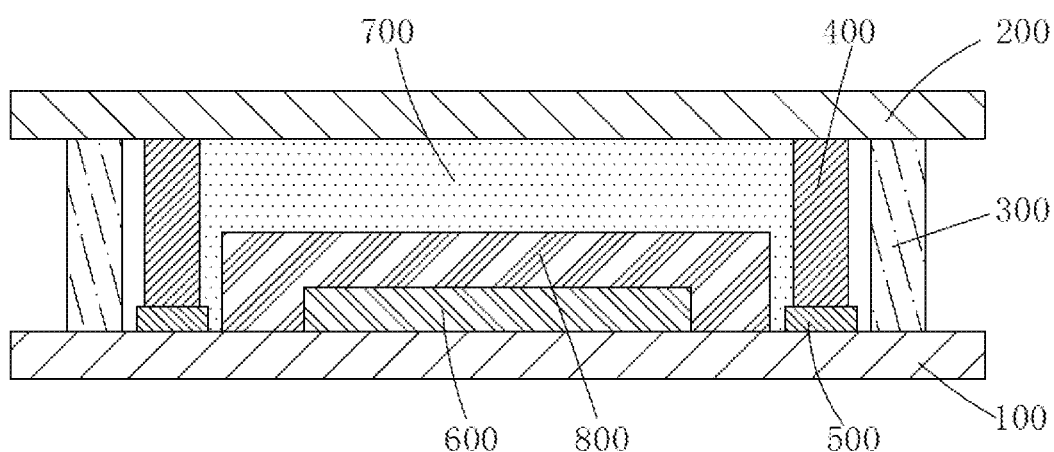
FIG. 6 is a schematic diagram for a encapsulation method of an OLED panel according to step S6 of the present disclosure, and a encapsulation structure of an OLED.

Step S6, referring to FIG. 6, vacuum sealing the TFT substrate 100 and the encapsulation cover plate 200 to make the sealant 300 in contact with the TFT substrate 100, and to make the inorganic insulating layer 500 in contact with the liquid metal 400, and then curing the sealant 300 to complete the encapsulation of the OLED panel. Specifically, the step S6 is performed in a nitrogen atmosphere. Specifically, in the step S6, the filling glue 700 is cured while the sealant 300 is cured. After the step S6, the filling glue 700 fills a space surrounded by the encapsulation cover plate 200, the liquid metal 400, the inorganic insulating layer 500, the TFT substrate 100, and the inorganic barrier 800. Specifically, in step S6, the sealant 300 and the filling glue 700 are cured by ultraviolet (UV) irradiation, heat curing, or both the ultraviolet radiation curing and heat curing. Specifically, a width of the inorganic insulating layer 500 needs to be set to be greater than a width of the liquid metal 400 after the step S6.

It should be noted that in the encapsulation method for an OLED panel according to the present disclosure, a circle of liquid metal 400 is disposed on the encapsulation cover plate 200 inside the sealant 300, and the inorganic insulating layer 500 is disposed on the TFT substrate 100 corresponding to the liquid metal 400 on the encapsulation cover plate 200, the sealant 300 is disposed between the TFT substrate 100 and the encapsulation cover plate 200 outside the OLED device 600 for connecting the TFT substrate 100 and the encapsulation cover plate 200. The liquid metal 400 is disposed between the OLED device 600 and the sealant 300, and is in contact with the inorganic insulting layer 500. When the external water and oxygen penetrates through the organic material sealant 300 into the encapsulation structure, the liquid metal 400 will react with the invading oxygen and forms a liquid metal oxide film on its surface to form a dense water-oxygen barrier layer, which can effectively prevent water and oxygen from entering to the OLED device 600, achieve a great encapsulation effect. Since the inorganic insulating layer 500 is disposed on the TFT substrate 100, the inorganic insulating layer 500 is disposed between the liquid metal 400 and the TFT substrate 100, which is capable to prevent a short circuit between the liquid metal 400 and the TFT array layer on the TFT substrate 100 and improve the reliability of the device.

Please refer to FIG. 6, based on the same invention concept, the present disclosure further provides a encapsulation structure of an OLED panel, comprising: a TFT substrate 100; an OLED device 600 disposed on the TFT substrate 100; a encapsulation cover plate 200 disposed above the TFT substrate 100; a sealant 300 disposed between the TFT substrate 100 and the encapsulation cover plate 200 outside the OLED device 600; an inorganic insulating layer 500 disposed on the TFT substrate 100 between the OLED device 600 and the sealant 300; a liquid metal 400 disposed between the inorganic insulating layer 500 and the encapsulation cover plate 200; an organic barrier layer 800 disposed on the TFT substrate 100 covering the OLED device 600; and an filling glue 700 filling a space surrounded by the encapsulation cover plate 200, the liquid metal 400, the inorganic insulating layer 500, the TFT substrate 100, and the inorganic barrier layer 800.

Specifically, the TFT substrate 100 includes the base substrate and a TFT array layer provided on the base substrate (not shown). The inorganic insulating layer 500 is disposed on the TFT array layer.

Specifically, the material of the package cover 200 is glass.

Specifically, the sealant 300 is an organic material sealant commonly used in the prior art.

Specifically, a material of the liquid metal 400 is a binary eutectic alloy of indium and gallium. Preferably, the binary eutectic alloy of indium and gallium has a mass ratio of indium to gallium of 1:3.

Specifically, a width of the inorganic insulating layer 500 is greater than a width of the liquid metal 400.

It should be noted that in the encapsulation structure of the OLED panel of the present disclosure, the sealant 300 is disposed between the TFT substrate 100 and the encapsulation cover plate 200 outside the OLED device 600 for connecting the TFT substrate 100 and the encapsulation cover plate 200. The liquid metal 400 is disposed between the OLED device 600 and the sealant 300. When the external water and oxygen penetrates through the organic material sealant into the encapsulation structure, the liquid metal 400 will react with the invading oxygen and forms a liquid metal oxide film on its surface to form a dense water-oxygen barrier layer, which can effectively prevent water and oxygen from entering the OLED device 600, achieve a great encapsulation effect. Since the inorganic insulating layer 500 is disposed between the liquid metal 400 and the TFT substrate 100, it is capable to prevent a short circuit between the liquid metal 400 and the TFT array layer on the TFT substrate 100 and improve the reliability of the device.

In summary, in the encapsulation method for an OLED panel of the present disclosure, a circle of liquid metal is disposed on the encapsulation cover plate inside the sealant, and the encapsulation cover plate and the TFT substrate are vacuum-sealed to obtain the encapsulation structure. When the external water and oxygen penetrates through the organic material sealant into the encapsulation structure, the liquid metal will react with the invading oxygen and forms a liquid metal oxide film on its surface to form a dense water-oxygen barrier layer, which can effectively prevent water and oxygen from entering the OLED device, achieve a great encapsulation effect. The encapsulation structure of the OLED panel provided by the present disclosure can effectively prevent water and oxygen from entering the OLED device and has good encapsulation effect.

Finally, it should be noted that the above embodiments are merely illustrative of the technical solutions of the present disclosure and are not intended to be limiting thereof. For the person skilled in the art of the disclosure, without departing from the concept of the disclosure, simple deductions or substitutions can be made and should be included in the protection scope of the disclosure.

What is claimed is:

1. A encapsulation method of an OLED panel, comprising the following steps:
   step S1, providing a encapsulation cover plate;
   step S2, coating a circle of sealant on the encapsulation cover plate;
   step S3, coating a circle of liquid metal on the encapsulation cover plate inside of the sealant;

step S4, providing a TFT substrate, and forming an inorganic insulating layer on the TFT substrate corresponding to the liquid metal on the encapsulation cover plate;

step S5: fabricating an OLED device on the TFT substrate inside the inorganic insulating layer;

step S6, vacuum sealing the TFT substrate and the encapsulation cover plate to make the sealant in contact with the TFT substrate, and to make the inorganic insulating layer in contact with the liquid metal, and curing the sealant to complete the encapsulation of the OLED panel.

2. The encapsulation method of an OLED panel according to claim 1, wherein in the step S3, after the liquid metal is coated, a filling glue is further coated on the encapsulation cover plate in a region inside the liquid metal;

in the step S5, further forms an inorganic barrier layer on the TFT substrate covering the OLED device after the OLED device is fabricated;

in the step S6, the filling glue is cured while curing the sealant; after the step S6, the filling glue fills a space surrounded by the encapsulation cover plate, the liquid metal, the inorganic insulating layer, the TFT substrate and the inorganic barrier layer.

3. The encapsulation method of an OLED panel according to claim 2, wherein the step S2, the step S3 and the step S6 are performed in a nitrogen atmosphere.

4. The encapsulation method of an OLED panel according to claim 1, wherein a width of the inorganic insulating layer is greater than a width of the liquid metal after the step S6.

5. The encapsulation method of an OLED panel according to claim 2, wherein
in the step S2, the sealant is coated through a nozzle;
in the step S3, the liquid metal is sprayed through the nozzle;
in the step S3, the filling glue is coated by dispenser;
in the step S5, the inorganic barrier layer is formed by low temperature plasma enhanced chemical vapor deposition;
in the step S6, the sealant and the filling glue are cured by ultraviolet light irradiation, heat curing, or both the ultraviolet light irradiation curing and heat curing.

6. The encapsulation method of an OLED panel according to claim 1, wherein a material of the liquid metal is a binary eutectic alloy of indium and gallium.

7. A encapsulation structure of an OLED panel, comprising: a TFT substrate; an OLED device disposed on the TFT substrate; a encapsulation cover plate disposed above the TFT substrate, a sealant disposed between the TFT substrate and the encapsulation cover plate outside the OLED device, an inorganic insulating layer disposed on the TFT substrate between the OLED device and the sealant, and a liquid metal disposed between the inorganic insulating layer and the encapsulation cover plate.

8. The encapsulation structure of an OLED panel according to claim 7, further comprising: an inorganic barrier layer disposed on the TFT substrate covering the OLED device, and an filling glue filling a space surrounded by the encapsulation cover plate, the liquid metal, the inorganic insulating layer, the TFT substrate, and the inorganic barrier layer.

9. The encapsulation structure of an OLED panel according to claim 7, wherein a width of the inorganic insulating layer is greater than a width of the liquid metal.

10. The encapsulation structure of an OLED panel according to claim 7, wherein a material of the liquid metal is a binary eutectic alloy of indium and gallium.

11. A encapsulation method of an OLED panel, comprising the following steps:
step S1, providing a encapsulation cover plate;
step S2, coating a circle of sealant on the encapsulation cover plate;
step S3, coating a circle of liquid metal on the encapsulation cover plate inside the sealant;
step S4, providing a TFT substrate, and forming an inorganic insulating layer on the TFT substrate corresponding to the liquid metal on the encapsulation cover plate;
step S5: fabricating an OLED device on the TFT substrate inside the inorganic insulating layer;
step S6, vacuum sealing the TFT substrate and the encapsulation cover plate to make the sealant in contact with the TFT substrate, and to make the inorganic insulating layer in contact with the liquid metal, and curing the sealant to complete the encapsulation of the OLED panel;
wherein in step S3, after the liquid metal is coated, a filling glue is further coated on the encapsulation cover plate in a region inside the liquid metal;
wherein in the step S5, the inorganic barrier layer covering the OLED device is formed on the TFT substrate after the OLED device is fabricated;
wherein in the step S6, the filling glue is cured while curing the sealant; after the step S6, the filling glue fills a space surrounded by the encapsulation cover plate, the liquid metal, the inorganic insulating layer, the TFT substrate and the inorganic barrier layer;
wherein, the step S2, the step S3 and the step S6 are all performed in a nitrogen atmosphere;
wherein a width of the inorganic insulating layer is greater than a width of the liquid metal after the step S6;
wherein a material of the liquid metal is a binary eutectic alloy of indium and gallium.

12. The encapsulation method of an OLED panel according to claim 11,
in the step S2, the sealant is coated through a nozzle;
in the step S3, the liquid metal is sprayed through the nozzle;
in the step S3, the filling glue is coated by dispenser;
in the step S5, the inorganic barrier layer is formed by low temperature plasma enhanced chemical vapor deposition;
in the step S6, the sealant and the filling glue are cured by ultraviolet light irradiation, heat curing, or both the ultraviolet light irradiation curing and heat curing.

* * * * *